United States Patent
Onishi (10) Patent No.: US 7,215,691 B2
(45) Date of Patent: May 8, 2007

(54) SEMICONDUCTOR LASER DEVICE AND METHOD FOR FABRICATING THE SAME

(75) Inventor: Toshikazu Onishi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 245 days.

(21) Appl. No.: 10/665,469

(22) Filed: Sep. 22, 2003

(65) Prior Publication Data

US 2005/0058169 A1    Mar. 17, 2005

(30) Foreign Application Priority Data

Sep. 19, 2002    (JP)    ............................. 2002-273015

(51) Int. Cl.
*H01S 5/00* (2006.01)
(52) U.S. Cl. .................. 372/45.01; 372/43.01
(58) Field of Classification Search ............. 372/43.01, 372/45.01
See application file for complete search history.

(56) References Cited

U.S. PATENT DOCUMENTS

| | | | | |
|---|---|---|---|---|
| 5,034,957 A | * | 7/1991 | Ohba et al. | ............... 372/45.01 |
| 5,036,521 A | * | 7/1991 | Hatakoshi et al. | ........ 372/45.01 |
| 5,805,630 A | * | 9/1998 | Valster et al. | ............ 372/50.12 |
| 5,814,531 A | * | 9/1998 | Anayama et al. | .............. 438/31 |
| 5,895,225 A | * | 4/1999 | Kidoguchi et al. | ............ 438/47 |
| 5,974,069 A | * | 10/1999 | Tanaka et al. | ........... 372/46.01 |
| 6,146,916 A | * | 11/2000 | Nanishi et al. | ................ 438/46 |
| 6,181,723 B1 | * | 1/2001 | Okubo et al. | ............. 372/45.01 |
| 6,351,480 B1 | * | 2/2002 | Akagi | ...................... 372/45.01 |
| 6,563,850 B1 | * | 5/2003 | Matsumoto et al. | ...... 372/45.01 |
| 6,618,415 B1 | * | 9/2003 | Ohitsu et al. | ............. 372/46.01 |
| 6,618,420 B1 | * | 9/2003 | Gen-Ei et al. | .............. 372/50.1 |
| 6,928,096 B2 | * | 8/2005 | Nomura et al. | ........... 372/46.01 |
| 6,940,884 B2 | * | 9/2005 | Ohitsu et al. | ............. 372/46.01 |
| 2002/0008242 A1 | * | 1/2002 | Hata | ............................ 257/79 |
| 2003/0138981 A1 | * | 7/2003 | Yamaguchi et al. | .......... 438/22 |
| 2004/0213313 A1 | * | 10/2004 | Akulova et al. | ............... 372/46 |

FOREIGN PATENT DOCUMENTS

| | | |
|---|---|---|
| JP | 2-257677 | 10/1990 |
| JP | 05-075201 | 3/1993 |
| JP | 09-219567 | 8/1997 |
| JP | 10-290043 | 10/1998 |
| JP | 11-284280 | 10/1999 |
| JP | 2000-286507 | 10/2000 |
| JP | 2001-144383 | 5/2001 |

\* cited by examiner

*Primary Examiner*—Minsun Oh Harvey
*Assistant Examiner*—Phillip Nguyen
(74) *Attorney, Agent, or Firm*—McDermott Will & Emery LLP (57) ABSTRACT

A semiconductor laser device has an active layer, a first cladding layer formed on the active layer, and a second cladding layer formed on the first cladding layer. The first cladding layer is doped with magnesium as a first impurity to have a high resistivity. The second cladding layer is doped with zinc as a second impurity to have a resistivity lower than the resistivity of the first cladding layer.

10 Claims, 8 Drawing Sheets

SEMICONDUCTOR LASER DEVICE AND METHOD FOR FABRICATING THE SAME

BACKGROUND OF THE INVENTION

The present invention relates to a semiconductor laser device composed of a group III–V compound semiconductor and, more particularly, to a semiconductor laser device capable of a high-output and low-voltage operation and to a method for fabricating the same.

Because of their ability to record information at an extremely high density, digital versatile disk (DVD) devices have achieved rapid widespread use in the fields of personal computers and audio-video equipment. In particular, growing expectations have been placed on further proliferation of writable or rewritable DVD devices as, e.g., external large-capacity memory devices (such as so-called DVD-R and DVD-RAM) or as next-generation video recorders (so-called DVD recorders) which are replacements for video tape recorders.

As a pick-up light source used in such a writable or rewritable DVD device to enable reading or rewriting of data, a semiconductor laser device which emits a red light beam at a wavelength of 650 nm has been used. To increase a writing speed in a DVD device, an operation with a high output over 100 mW has been required of a semiconductor laser device in recent years.

In the semiconductor laser device which emits the red light beam, an AlGaInP-based compound semiconductor which is a group III–V compound semiconductor containing at least one of aluminum (Al), gallium (Ga), and indium (In) as a group III element and containing phosphorus as a group V element is used in an active layer and a cladding layer.

Figure 8:
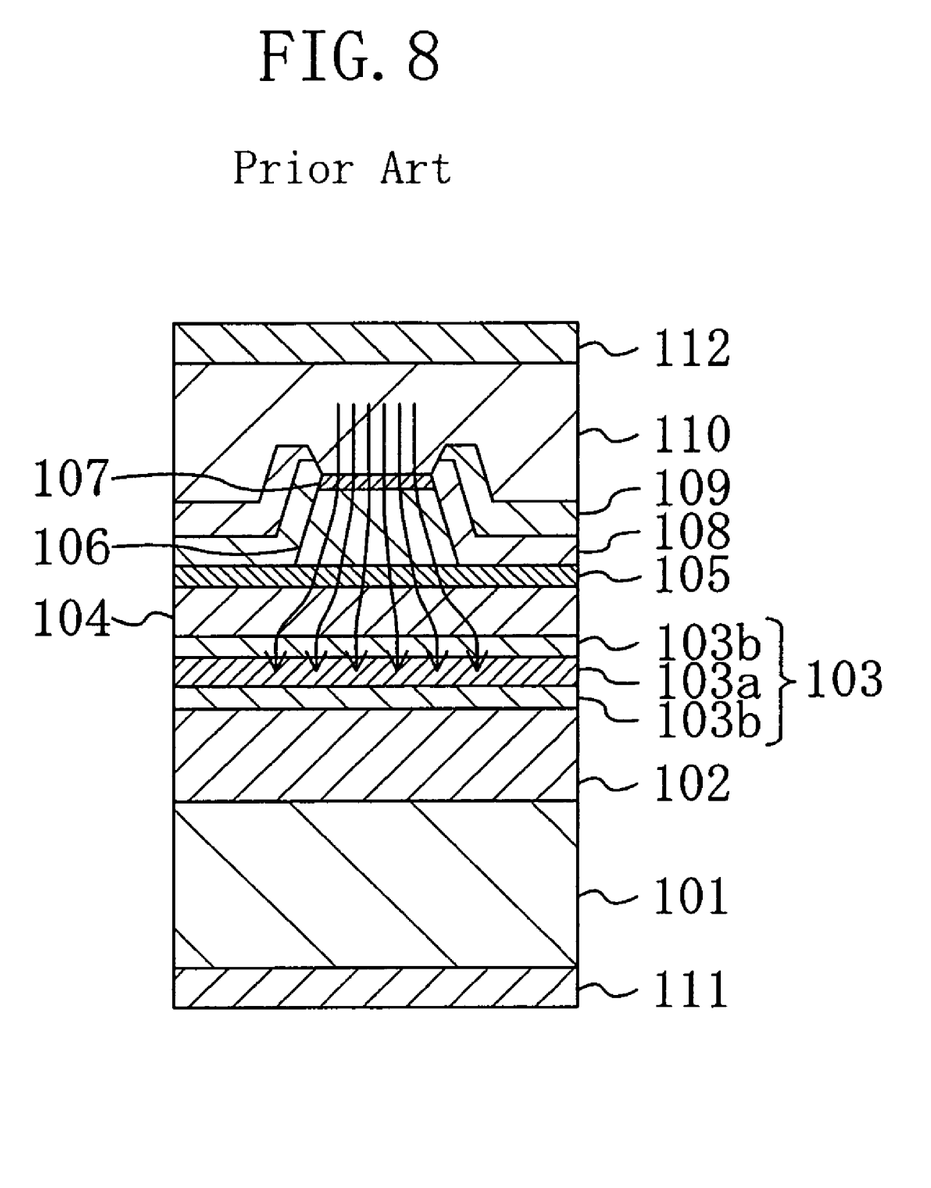
FIG. 8 is a structural cross-sectional view of a conventional semiconductor laser device.

FIG. 8 shows a cross-sectional structure of a conventional semiconductor laser device composed of an AlGaInP-based compound semiconductor. As shown in FIG. 8, the conventional semiconductor laser device is constituted by: an n-type substrate 101 made of gallium arsenide (GaAs); an n-type cladding layer 102 made of n-type AlGaInP; an active layer 103 composed of a multiple quantum well layer 103a consisting of well layers made of GaInP and barrier layers made of AlGaInP, which are alternately stacked, and upper and lower optical guide layers 103b made of AlGaInP and formed with the multiple quantum well layer 103a interposed therebetween; a first p-type cladding layer 104 made of p-type AlGaInP; an etching stopper layer 105 made of p-type GaInP; a ridge-shaped second p-type cladding layer 106 made of p-type AlGaInP; a first contact layer 107 made of p-type GaInP; a first current blocking layer 108 made of n-type AlInP and formed to sandwich the second p-type cladding layer 106; a second current blocking layer 109 made of n-type GaAs; and a second contact layer 110 made of p-type GaAs.

An n-side electrode 111 made of a metal material is formed on the lower side of the n-type substrate 101 to make ohmic contact therewith, while a p-side electrode 112 made of a metal material is formed on the upper side of the second contact layer 109 to make ohmic contact therewith.

In the conventional semiconductor laser device, current components injected from the p-side electrode 112 by the application of a specified voltage to the n-side electrode 111 and to the p-side electrode 112 are confined by respective pn junctions between the ridge-shaped second cladding layer 106 and the first current blocking layer 108 and between the first and second current blocking layers 108 and 109 to reach the active layer 103 through the second p-type cladding layer 105 and the first p-type cladding layer 104 and cause radiative recombination in the active layer 103, so that a laser beam with a wavelength of about 650 nm corresponding to the band gap of the well layer is emitted. In this case, a multilayer structure composed of the second p-type cladding layer 106, the first p-type cladding layer 104, the active layer 103, and the n-type cladding layer 102 serves as a resonator.

To enable the conventional semiconductor laser device to perform a high-output operation, it is important to heavily dope the first p-type cladding layer 104 with a p-type impurity. If the impurity concentration in the first p-type cladding layer 104 is low, electrons injected from the n-side electrode 111 into the active layer 103 overflows from the active layer 103 to the first p-type cladding layer 104. The overflow of electrons reduces a threshold current and an operating current so that a sufficient output is not obtained.

If the first p-type cladding layer 104 is heavily doped with a p-type impurity, however, the p-type impurity is diffused into the active layer 103 to form a nonradiative recombination center so that the temperature characteristic of the semiconductor device deteriorates and the reliability thereof is degraded.

The provision of an undoped spacer layer between the active layer 103 and the first p-type cladding layer 104 prevents the diffusion of the p-type impurity into the active layer 103 even if the p-type impurity concentration in the first p-type cladding layer 104 is increased.

By doping the first and second p-type cladding layers 104 and 106 with magnesium (Mg) with a low diffusion coefficient, the p-type impurity becomes less likely to be diffused into the active layer 103 so that the p-type impurity concentration in each of the semiconductor layers is increased.

In the conventional semiconductor laser device, however, currents are confined in the ridge-shaped second p-type cladding layer 106, pass through the first p-type cladding layer 104, while being diffused therein, and reach the active layer 103. Consequently, the currents are diffused not only in the portion of the first p-type cladding layer 104 underlying the second p-type cladding layer 105 but also in the other region of the first p-type cladding layer 104. In the region of the active layer 103 other than the portion thereof underlying the second p-type cladding layer 105, therefore, a sufficient current density for the oscillation of a laser beam cannot be obtained.

Thus, the conventional semiconductor laser device described above has a problem that a high output cannot be obtained therefrom because ineffective currents resulting from the diffusion of currents in the cladding layer formed on the active layer reduce a luminous efficiency and increase a threshold current as well as an operating current.

If the impurity concentration in the first p-type cladding layer 104 is increased to suppress the overflow of electrons, the electric conductivity of the first p-type cladding layer 104 is increased so that a current is more likely to be diffused even in a direction parallel with the first p-type cladding layer 104 and the ineffective currents are increased disadvantageously.

SUMMARY OF THE INVENTION

It is therefore an object of the present invention to solve the foregoing conventional problems and thereby enabling a semiconductor laser device to perform a high-output operation by reducing an ineffective current resulting from the diffusion of a current in a cladding layer.

To attain the foregoing object, a semiconductor laser device according to the present invention comprises: an active layer; and a first cladding layer formed on the active layer, the first cladding layer being doped with a first impurity to have a high resistivity.

In the semiconductor laser device according to the present invention, the resistivity of the first cladding layer has been increased so that a driving current for the semiconductor laser device is less likely to be diffused in the first cladding layer. This reduces an ineffective current and allows efficient injection of the current into the active layer, thereby enabling a high-output operation. Since the first cladding layer is constituted such that the resistivity thereof is increased through doping with the first impurity, the carrier concentration and compound composition of the first cladding layer need not be changed so that the electric characteristic of the semiconductor laser is not degraded.

Preferably, the semiconductor laser device according to the present invention further comprises: a second cladding layer formed on the first cladding layer, the second cladding layer being doped with a second impurity to have a resistivity lower than the resistivity of the first cladding layer.

The arrangement achieves a reduction in the series resistance of the semiconductor laser device and enables the semiconductor laser device to perform a high-output operation by reducing the threshold current and operating current thereof.

In the semiconductor laser device according to the present invention, the first and second cladding layers are preferably made of respective compound semiconductors having substantially the same mobilities.

The arrangement allows the respective resistivities of the first and second cladding layers to be set individually by using different impurities for doping and allows the resistivity of the first cladding layer to be higher than that of the second cladding layer.

In the semiconductor laser device according to the present invention, each of the first and second cladding layers is preferably made of a compound semiconductor containing phosphorus, the first impurity is preferably magnesium, and the second impurity is preferably zinc.

Since magnesium used as a dopant lowers the mobility of carriers in a compound semiconductor containing phosphorus to a higher degree than zinc, the resistivity of the first cladding layer becomes higher than the resistivity of the second cladding layer.

In this case, a concentration of the first impurity in the first cladding layer is preferably not less than $5\times10^{16}$ cm$^{-3}$ and not more than $1\times10^{18}$ cm$^{-3}$. The arrangement reliably suppresses the diffusion of the first impurity into the active layer, while increasing the resistivity of the first cladding layer.

In the semiconductor laser device according to the present invention, the first cladding layer preferably also contains a third impurity.

Since the arrangement allows an increased impurity concentration in the first cladding layer, the overflow of the carriers injected in the active layer into the first cladding layer can be suppressed so that the temperature characteristic of the semiconductor laser device is improved.

In the semiconductor laser device according to the present invention, each of the first and second cladding layers is preferably made of a compound semiconductor containing phosphorus, the first impurity is preferably magnesium, and each of the second and third impurities is preferably zinc.

In this case, a total concentration of the first and third impurities in the first cladding layer is preferably not less than $1\times10^{18}$ cm$^{-3}$ and not more than $5\times10^{18}$ cm$^{-3}$.

In the semiconductor laser device according to the present invention, each of the first and second cladding layers is preferably made of a compound semiconductor containing arsenic, the first impurity is preferably carbon, and the second impurity is preferably zinc.

In the semiconductor laser device according to the present invention, the second cladding layer is preferably formed into a ridge-shaped configuration on the first cladding layer.

In the semiconductor laser device according to the present invention, the second cladding layer preferably has a lower portion thereof formed into a stripe configuration.

A method for fabricating a semiconductor laser device according to the present invention comprises the steps of: forming an active layer on a substrate; and forming a first cladding layer on the active layer, while doping the first cladding layer with a first impurity, wherein in the step of forming the first cladding layer, the first impurity is doped so that the first cladding layer has a high resistivity.

In accordance with the method for fabricating a semiconductor laser device of the present invention, the resistivity of the first cladding layer has been increased to have a high value so that a current component diffused in the first cladding layer is reduced. Therefore, a semiconductor laser device capable of a high-output operation can be obtained.

Preferably, the method for fabricating a semiconductor laser device according to the present invention further comprises the step of: forming a second cladding layer on the first cladding layer, while doping the second cladding layer with a second impurity, wherein in the step of forming the second cladding layer, the second impurity is doped so that the resistivity of the first cladding layer is higher than a resistivity of the second cladding layer.

In the method for fabricating a semiconductor laser device according to the present invention, each of the first and second cladding layers is preferably made of a compound semiconductor containing phosphorus, the first impurity is preferably magnesium, and the second impurity is preferably zinc.

In the method for fabricating a semiconductor laser device according to the present invention, the step of forming the first cladding layer preferably includes doping the first cladding layer with a third impurity in addition to the first impurity.

In the method for fabricating a semiconductor laser device according to the present invention, each of the first and second cladding layers is preferably made of a compound semiconductor containing phosphorus, the first impurity is preferably magnesium, and each of the second and third impurities is preferably zinc.

DETAILED DESCRIPTION OF THE INVENTION

Each of the embodiments of the present invention pertains to a semiconductor laser device having an active layer and first and second cladding layers formed successively on the active layer. By increasing the resistivity of the first cladding layer, the diffusion of a current in the first cladding layer is suppressed. A description will be given first to the principle of problem solution common to the individual embodiments with reference to the drawings.

In the present specification, AlGaInP represents a compound containing at least one of aluminum (Al), gallium (Ga), and indium (In) as a group III element and containing phosphorus (P) as a group V element. In particular, GaInP represents a case where Al is not contained in AlGaInP and AlInP represents a case where Ga is not contained in AlGaInP. On the other hand, AlGaAs represents a compound containing at least one of Al and Ga as a group III element and containing arsenic (As) as a group V element.

Figure 1:
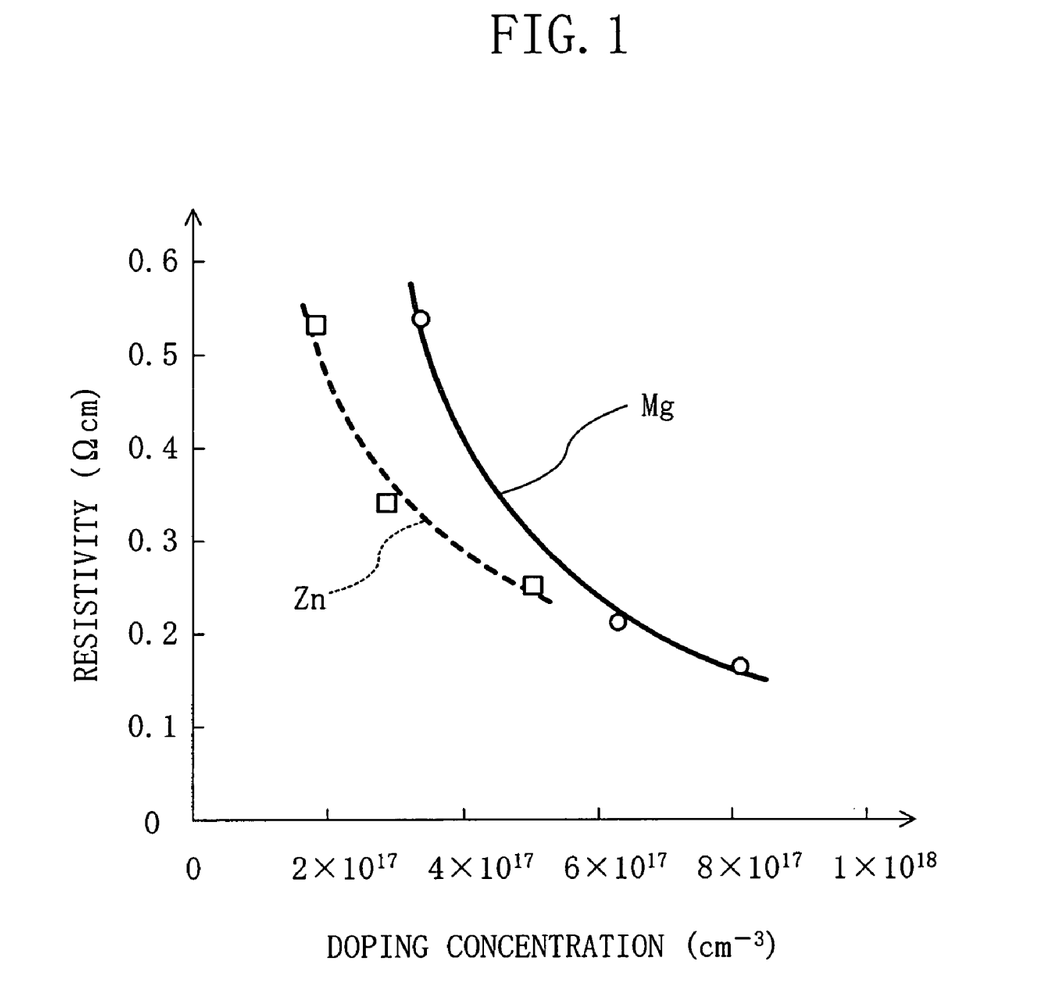
FIG. 1 is a graph for illustrating the principle of problem solution used in each of the embodiments of the present invention, which shows a relationship between the doping concentration in a semiconductor layer made of AlGaInP and the resistivity thereof.

FIG. 1 is a graph showing the result of an experiment which measured a relationship between the concentration of a p-type dopant used to dope a semiconductor layer made of AlGaInP (AlGaInP layer) which has been formed by metal organic chemical vapor deposition (MOCVD), while being doped with the p-type dopant and the resistivity of the AlGaInP layer that has been formed. In FIG. 1, the square mark (□) represents data obtained when zinc (Zn) is used as the p-type dopant and the circle mark (○) represents data obtained when magnesium (Mg) is used as the p-type dopant.

The experiment the result of which is shown in FIG. 1 used triethylgallium (TEG), trimethylaluminum (TMA), and trimethylindium (TMI) each as a source gas for a group III compound, used phosphin ($PH_3$) and arsine ($AsH_3$) each as a source for a group V compound, and used dimethylzinc ($Zn(CH_3)_2$) or biscyclopentadienyl magnesium ($((C_5H_5)_2 Mg)$) each as a source for a p-type impurity. As growing conditions, the pressure of a source gas adjusted to about $1.0 \times 10^4$ Pa (about 76 Torr) and the substrate temperature adjusted to about 750° C. were used.

As shown in FIG. 1, the resistivity of the AlGaInP layer decreases as the doping concentration therein increases in either of the cases where Zn is used as a p-type dopant and where Mg is used as a p-type dopant. In general, the resistivity of a semiconductor is inversely proportional to the product of mobility and carrier concentration. The mobility used herein has a value substantially determined by the composition of the semiconductor material. The carrier concentration used herein has a value which increases as the doping concentration increases. By increasing the doping concentration, therefore, the carrier concentration in the AlGaInP layer increases so that the resistivity thereof is reduced.

It will be understood from FIG. 1 that, if a comparison is made between the respective cases where zinc (Zn) and magnesium (Mg) at the same concentration are used for doping, a lower resistivity is achieved in the case where Zn is used for doping. This is because Mg has a higher effect of scattering carriers in the AlGaInP layer than Zn so that the mobility in the AlGaInP layer is lowered by the scattering of carriers.

In the case of using a group III–V compound semiconductor for a semiconductor laser device, the compound composition and doping concentration of each of semiconductor layers composing the semiconductor laser device are set to specified values such that the semiconductor laser device has desired electric characteristics. If the compound composition and doping concentration are changed, the electric characteristics of the semiconductor laser device deteriorate so that it is difficult to adjust the resistivity to a desired value by changing the doping concentration and compound composition.

As described above with reference to FIG. 1, however, the experiment conducted by the present inventors has proved that the value of the resistivity can be adjusted by selecting a dopant species. The semiconductor laser device according to each of the following embodiments has been designed such that the resistivity is adjustable by selecting respective dopant species to be used in the first and second p-type cladding layers made of compound semiconductors having substantially the same mobilities without changing the compound composition and doping concentration.

Although the resistivity of the AlGaInP layer is lower in the case of using Zn as a dopant than in the case of using Mg as a dopant in the result of the experiment shown in FIG. 1, there may be a case where Mg used as a dopant in the AlGaInP layer achieves a low resistivity than Zn used as a dopant.

Although the description has been given to the dopants for doping the semiconductor layers made of AlGaInP with reference to FIG. 1, if a comparison is made between the respective cases where carbon (C) and zinc (Zn) are used for doping a semiconductor layer made of AlGaAs, a higher resistivity is achieved in the case of using carbon.

Embodiment 1

The first embodiment of the present invention will be described herein below with reference to the drawings.

Figure 2:
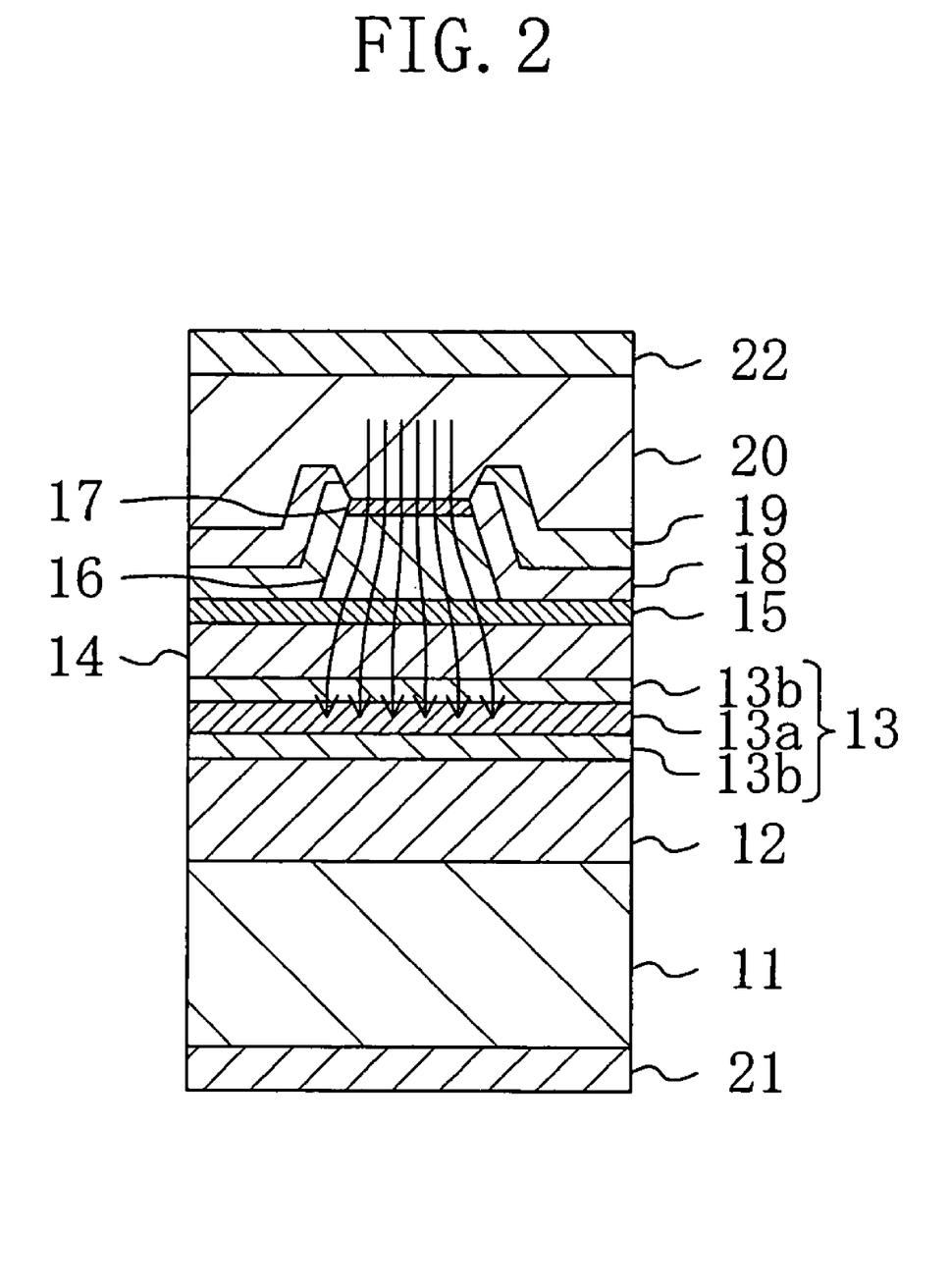
FIG. 2 is a structural cross-sectional view of a semiconductor laser device according to the first embodiment of the present invention.

FIG. 2 shows a cross-sectional structure of the semiconductor laser device according to the first embodiment. In FIG. 2, the arrows indicate the paths of currents flowing during the driving of the semiconductor laser device.

As shown in FIG. 2, an n-type cladding layer 12 made of n-type $Al_{0.35}Ga_{0.15}In_{0.5}$ with a film thickness of about 2 μm, an active layer 13 having a multiple quantum well structure made of undoped AlGaInP, a first p-type cladding layer 14 made of p-type $Al_{0.35}Ga_{0.15}In_{0.5}P$ with a film thickness of about 0.2 μm, and an etching stopper layer 15 made of p-type $Ga_{0.5}In_{0.5}P$ with a film thickness of about 10 nm are deposited successively by crystal growth on an n-type substrate 11 made of gallium arsenide (GaAs) with a thickness of about 100 μm. A second p-type cladding layer 16 made of p-type $Al_{0.35}Ga_{0.15}In_{0.5}P$ with a film thickness of about 1 μm and formed into a ridge-shaped configuration and a first contact layer 17 made of p-type $Ga_{0.5}In_{0.5}P$ with a film thickness of about 50 nm are formed on the etching stopper layer 15.

A first current blocking layer 18 made of n-type $Al_{0.5}In_{0.5}P$ with a film thickness of about 0.3 μm and a second current blocking layer 19 made of n-type GaAs with a film thickness of about 0.3 μm are stacked successively to cover the upper surface of the etching stopper layer 15 and the respective sidewall surfaces of the second p-type cladding layer 16 and the first contact layer 17. A second contact layer 20 made of p-type GaAs with a film thickness of about 3 μm is further formed over the first contact layer 17 and the second current blocking layer 19.

An n-side electrode 21 made of a metal material composed of an alloy containing, e.g., Au, Ge, and Ni is formed on the lower side of the n-type substrate 11 to make ohmic contact therewith. On the other hand, a p-side electrode 22 made of a metal material composed of an alloy containing Cr, Pt, and Au is formed on the upper side of the second contact layer 20 to make ohmic contact therewith.

The active layer 13 is composed of: a multiple quantum well layer 13a consisting of well layers each made of $Ga_{0.5}In_{0.5}P$ with a film thickness of about 6 nm and barrier layers each made of $Al_{0.25}Ga_{0.25}In_{0.5}P$ with a film thickness of about 5 nm, which are alternately stacked; and upper and lower optical guide layers 13b each made of $Al_{0.25}Ga_{0.25}In_{0.5}P$ with a film thickness of about 30 nm to have the multiple quantum well layer 13a interposed therebetween.

Each of the n-type cladding layer 12, the first p-type cladding layer 14, and the second p-type cladding layer 16 is made of a semiconductor material having a larger band gap than any of the semiconductor layers composing the active layer 13, so that carriers are confined in the active layer 13. In an AlGaInP-based semiconductor material, the band gap can be increased by relatively increasing the composition of Al. Although the compound semiconductors having the same composition have been used for the first and second p-type cladding layers, it is also possible to adjust the composition ratio between Al and Ga in each of the compound semiconductors such that band gaps larger than in the semiconductor layers composing the active layer 13 are provided.

With the second p-type cladding layer 16 formed into a ridge-shaped configuration, the semiconductor layer device according to the first embodiment has a so-called ridge stripe waveguide structure in which the respective portions of the n-type cladding layer 12, the active layer 13, the first p-type cladding layer 14, and the etching stopper layer 15 underlying the second p-type cladding layer 16 and the second p-type cladding layer 16 serve as a waveguide. By using AlInP for the first current blocking layer 18, an effective index waveguide is provided.

The etching stopper layer 15 is made of a semiconductor material having a low Al composition to exhibit a high etching selectivity to the first p-type cladding layer 14 during etching for forming the second p-type cladding layer 16 into the ridge-shaped configuration such that the first p-type cladding layer 14 is not etched.

On the other hand, GaAs is used for the second contact layer 20 for easy ohmic contact with the metal material. The first contact layer 17 reduces the band discontinuity between the second p-type cladding layer 16 and the second contact layer 20.

Table 1 shows specific dopant species and doping concentrations in the individual layers of the semiconductor laser device thus constituted.

TABLE 1

| Semiconductor Layer | Thickness | Compound Composition | Dopant | Concentration (cm$^{-3}$) |
|---|---|---|---|---|
| 2nd Contact Layer | 3 μm | GaAs | Zn | $3 \times 10^{18}$ |
| 2nd Current blocking layer | 0.3 μm | GaAs | Si | $1 \times 10^{18}$ |
| 1st Current blocking layer | 0.3 μm | $Al_{0.5}In_{0.5}P$ | Si | $1 \times 10^{18}$ |
| 1st Contact Layer | 50 nm | $Ga_{0.5}In_{0.5}P$ | Zn | $1 \times 10^{18}$ |
| 2nd p-Type Cladding layer | 1 μm | $Al_{0.35}Ga_{0.15}In_{0.5}P$ | Zn | $1 \times 10^{18}$ |
| Etching Stopper Layer | 10 nm | $Ga_{0.5}In_{0.5}P$ | Mg | $1 \times 10^{18}$ |
| 1st p-Type Cladding layer | 0.2 μm | $Al_{0.35}Ga_{0.15}In_{0.5}P$ | Mg | $5 \times 10^{17}$ |
| Active Layer Quantum Well Layer | | | | |
| Well Layers | 6 nm Each | $Ga_{0.5}In_{0.5}P$ | — | — |
| Barrier Layers | 5 nm Each | $Al_{0.25}Ga_{0.25}In_{0.5}P$ | — | — |
| Optical Guide Layers | 30 nm Each | $Al_{0.25}Ga_{0.25}In_{0.5}P$ | — | — |
| n-Type Cladding layer | 2 μm | $Al_{0.35}Ga_{0.15}In_{0.5}P$ | Si | $1 \times 10^{18}$ |
| n-Type Substrate | 100 μm | GaAs | Si | $1 \times 10^{18}$ |

As shown in Table 1, each of the first p-type cladding layer 14 and the etching stopper layer 15 is doped with magnesium (Mg) as a p-type dopant and each of the second p-type cladding layer 16 and the first and second contact layers 17 and 20 is doped with zinc (Zn) as a p-type dopant in the semiconductor laser device according to the first embodiment. The doping concentration in the first p-type cladding layer 14 is about $5 \times 10^{17}$ cm$^{-3}$ and the doping concentration in the second p-type cladding layer 16 is about $1 \times 10^{18}$ cm$^{-3}$. As an n-type dopant, silicon (Si) at a concentration of about $1 \times 10^{18}$ cm$^{-3}$ is used.

On the other hand, Zn is used as a dopant for the second contact layer 20. This is because, if Mg is used as a dopant for an AlGaAs-based semiconductor, a problem termed delayed doping in which the semiconductor is not doped continuously with Mg even after the supply of a source for Mg is initiated or a problem termed memory effect in which the semiconductor is doped continuously with Mg even after the supply of the source for Mg is halted occurs so that a specified doping concentration is not obtained. Even if Mg is used as a dopant for each of the semiconductor layers made of an AlGaInP-based semiconductor, the problems of delayed doping and memory effect do not occur so that a desired doping concentration is obtained.

In the semiconductor laser device according to the first embodiment, a specified voltage is applied between the n-side electrode 21 and the p-side electrode 22 so that holes injected from the p-side electrode are confined by respective pn junctions between the second p-type cladding layer 16 and the first current blocking layer 18 and between the first and second current blocking layers 18 and 19 to reach the active layer 13 through the first p-type cladding layer 14. As a result, the holes are injected at a high density in the portion of the active layer 13 underlying the second p-type cladding layer 16 to be radiatively recombined with electrons injected from the n-side electrode 21 so that laser beam oscillation at a wavelength of about 650 nm corresponding to the band gap of the well layer occurs.

The first embodiment is characterized in that Mg is used as a dopant (first impurity) for doping the first p-type cladding layer 14 and Zn is used as a dopant (second impurity) for doping the second p-type-cladding layer 16.

As described above with reference to FIG. 1, the semiconductor layer made of AlGaInP has a higher resistivity when it is doped with Zn than with Mg. This allows the first p-type cladding layer 14 to be formed with a resistivity higher than that of the second p-type cladding layer 16 even if respective semiconductor materials having the same components are used for the first and second cladding layers 14 and 16.

That is, the semiconductor laser device according to the first embodiment has been designed such that the first p-type cladding layer 14 has a resistivity higher than that of the second p-type cladding layer 16 by doping the first p-type cladding layer 14 with Zn having a larger carrier scattering effect and doping the second p-type cladding layer 16 having a smaller carrier scattering effect.

A description will be given below to the effect achieved by increasing the resistivity of the first p-type cladding layer 14 with reference to the drawings.

Figure 3:
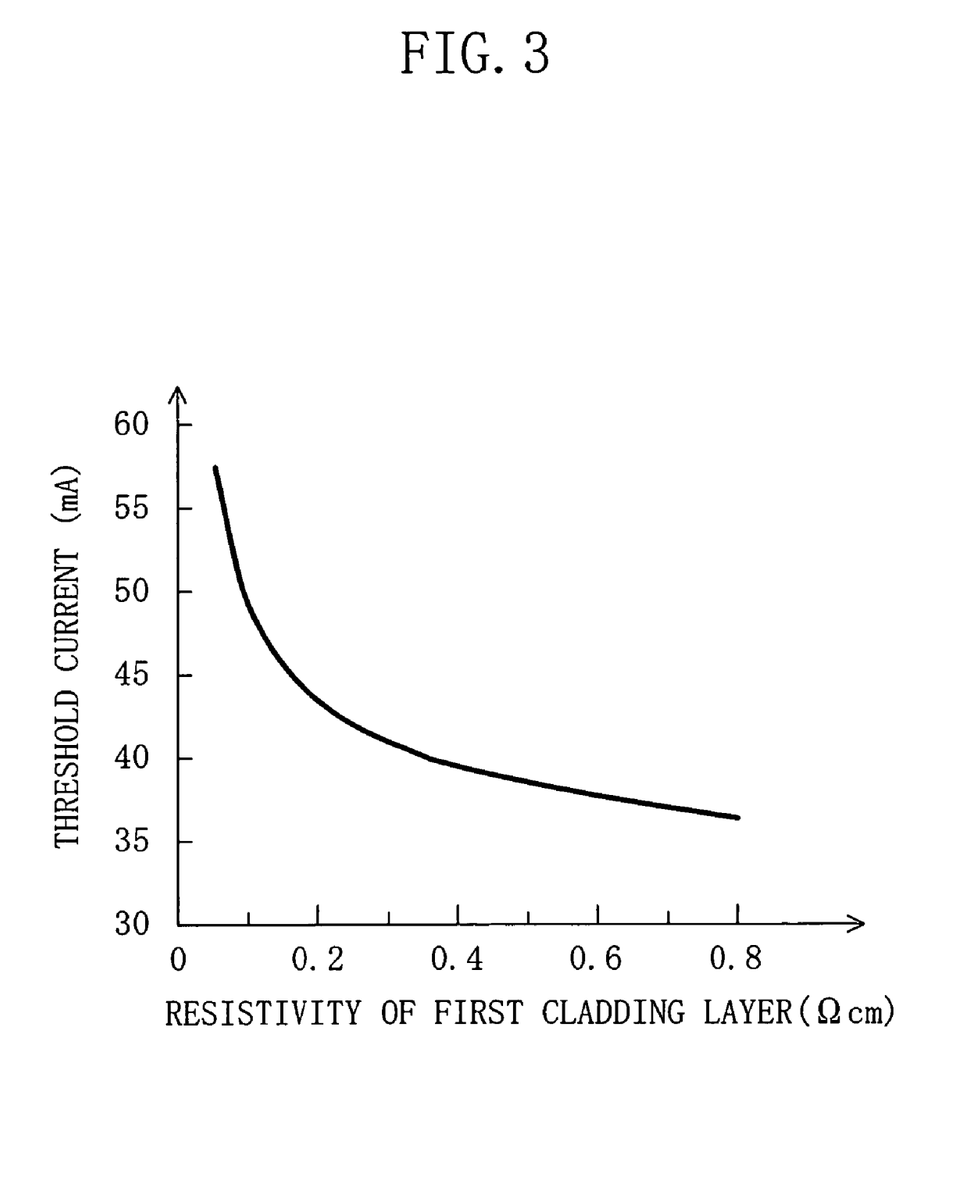
FIG. 3 is a graph showing a relationship between the resistivity and threshold current of a first p-type cladding layer in the semiconductor laser device according to the first embodiment.

FIG. 3 shows variations in the threshold current of the semiconductor laser device according to the first embodiment when the resistivity of the first p-type cladding layer 14 is changed. In FIG. 3, the abscissa axis represents the resistivity of the first p-type cladding layer and the ordinate axis represents the threshold current of the semiconductor laser device.

It is obvious from FIG. 3 that the threshold current of the semiconductor laser device decreases as the resistivity of the first p-type cladding layer 14 increases. This is because the diffusion of the current is less likely to occur in the first p-type cladding layer 14 as the resistivity of the first p-type cladding layer 14 is higher. Consequently, of current components taking paths from the second p-type cladding layer 16 to the active layer 13, those flowing outwardly of the portion underlying the second p-type cladding layer 16 are reduced so that the current density in the portion underlying the second p-type cladding layer 16 is increased and therefore the current is injected efficiently into the active layer 13.

As shown specifically by the arrows in FIG. 2, the currents confined by the first and second current blocking layers 18 and 19 flow from the second p-type cladding layer 16 and reach the portion of the active layer 13 underlying the second p-type cladding layer 16 without being substantially diffused in the first p-type cladding layer 14.

As a result, radiative recombination occurs efficiently in the portion of the active layer 13 underlying the second p-type cladding layer 16. This reduces the threshold current and operating current of the semiconductor layer device and implements a high-output semiconductor laser device.

Although the etching stopper layer 15 has been heavily doped with Mg, sidewise diffusion of the current barely occurs even if the impurity concentration is increased since the etching stopper layer 15 has an extremely thin film thickness of about 10 nm.

Since the mobility of carriers is higher in an AlGaInP-based semiconductor material when it is doped with Zn than with Mg, a lower resistance can be achieved by doping the second p-type cladding layer 16 with Zn so that the series resistance of the semiconductor laser device is reduced advantageously.

Specifically, in the semiconductor laser device according to the first embodiment, the first p-type cladding layer 14 made of AlGaInP is doped with Mg at a concentration of about $5 \times 10^{17}$ cm$^{-3}$ so that the resistivity thereof becomes about 0.3 Ω cm. As shown in FIG. 3, the threshold value of the semiconductor laser device at this time is about 40 mA. The output of the semiconductor laser device is not saturated even in an environment in which the temperature is about 70° C. and the semiconductor laser device is operable with an output as high as 120 mW.

The concentration of Mg used to dope the first p-type cladding layer 14 is preferably adjusted to about $5 \times 10^{16}$ c$^{-3}$ to $1 \times 10^{18}$ cm$^{-3}$ If the concentration of Mg is lower than $5 \times 10^{16}$ cm$^{-3}$, a sufficiently high potential barrier cannot be provided against electrons in the first p-type cladding layer 14 so that the electrons injected from the n-side electrode overflow from the active layer 13 to the first p-type cladding layer 14. If the concentration of Mg is higher than $1 \times 10^{18}$ cm$^{-3}$, on the other hand, Mg is diffused from the first p-type cladding layer 14 to the active layer 13 to degrade the crystalline quality of the active layer 13. This may degrade the reliability of the semiconductor laser device.

Thus, in the semiconductor laser device according to the first embodiment, the first p-type cladding layer 14 is formed to have a relatively high resistance so that the diffusion of the current is less likely to occur in the first cladding layer. This reduces the threshold current and operating current of the semiconductor laser device, improves the temperature characteristic thereof, and allows a high-output operation thereof.

Although the first embodiment has used magnesium to dope the first p-type cladding layer 14 and zinc to dope the second p-type cladding layer 16, impurities used in the first and second cladding layers 14 and 16 may come in any combination provided that the carrier scattering effect is relatively large in the fist p-tape cladding layer 14 and relatively small in the second cladding layer 16.

The first p-type cladding layer 14 need not necessarily be doped with Mg over the entire direction of thickness thereof. It is also possible to dope the lower portion of the first p-type cladding layer 14 with Mg and dope the upper portion thereof with Zn. In the arrangement also, a current is diffused in the upper portion of the first p-type cladding layer 14 but the diffusion of the current is suppressed successfully in the lower portion thereof. Compared with the case where the first p-type cladding layer 14 is doped only with magnesium over the entire direction of thickness thereof therefore, the current at a high density is injected into the active layer 13.

In the first embodiment, a substrate made of p-type GaAs may also be used in place of the n-type substrate 11.

Although the first embodiment has adjusted the composition of In to about 0.5 in each of the semiconductor layers made of AlGaInP to achieve lattice matching between the semiconductor layer and the n-type substrate 11, it is sufficient for the composition of In to be in a range not less than 0.45 and not more than 0.55. The arrangement allows each of the semiconductor layers made of AlGaInP to be formed such that lattice matching is achieved in the semiconductor layer and GaAs composing the n-type substrate 11.

It is also possible to form a complex refraction index waveguide structure by using GaAs instead of AlInP as a material composing the first current blocking layer 18, The active layer 13 is not limited to the structure using the multiple quantum well layer 13a. The active layer 13 may be an active layer having a single quantum well structure in which only one well layer made of GaInP is formed or a bulk active layer having a single structure.

Fabrication Method of Embodiment 1

A method for fabricating the semiconductor laser device according to the first embodiment will be described with reference to the drawings.

FIGS. 4A and 4B and FIGS. 5A and 5B show cross-sectional structures of the semiconductor laser device according to the first embodiment in the individual process steps of the fabrication method therefor. The description of the components shown in FIGS. 4A and 4B and FIGS. 5A and 5B which are the same as shown in FIG. 1 will be omitted by retaining the same reference numerals.

Figure 4A:
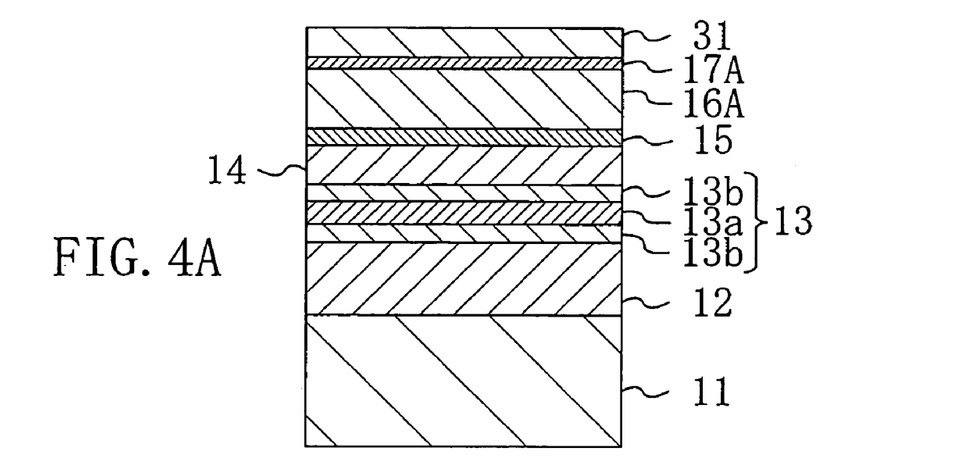
FIGS. 4A and 4B are structural cross-sectional views illustrating the individual process steps of a method for fabricating the semiconductor laser device according to the first embodiment.

First, as shown in FIG. 4A, the n-type cladding layer 12, the active layer 13, the first p-type cladding layer 14, the etching stopper layer 15, a second-p-type-cladding layer forming layer 16A, a first-contact-layer forming layer 17A, and a cap layer 31 made of GaAs are grown successively on the n-type substrate 11 by, e.g., metal organic chemical vapor deposition (MOCVD). The cap layer 31 prevents the surface of the first-contact-layer forming layer 17A from being oxidized during a period of transition to the subsequent photolithographic step.

In the step of forming each of the semiconductor layers by MOCVD, each of triethylgallium (TEG), trimethylaluminum (TMA), and trimethylindium (TMI) is used as a source for a group III compound and each of phosphin ($PH_3$) and arsine ($AsH_3$) is used as a source for a group V compound. By using hydrogen as a carrier gas, these sources are introduced into a reaction vessel made of quartz. Under the conditions under which the inner pressure of the reaction vessel is about $1.0 \times 10^4$ Pa (about 76 Torr) and the substrate temperature is about 750° C., the individual semiconductor layers are deposited successively by crystal growth by properly switching the source being supplied and the amount of the source being supplied. By introducing, e.g., dimethylzinc ($Zn(CH_3)_2$) or biscyclopentadienyl magnesium ($(C_5H_5)_2Mg$) as a source for a p-type impurity during the crystal growth of each of the semiconductor layers, each of the semiconductor layers can be doped with a desired p-type impurity.

Figure 4B:
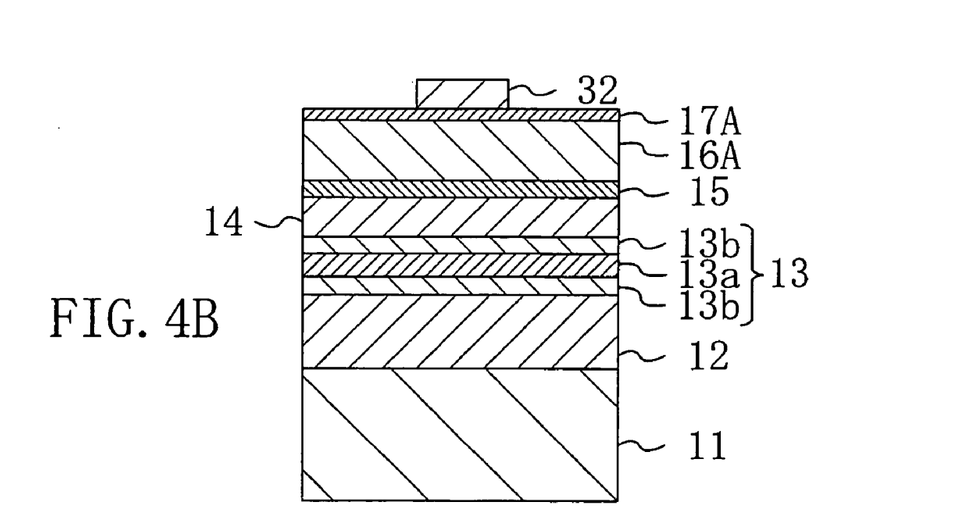

Next, as shown in FIG. 4B, the cap layer 31 is etched away and then a silicon oxide film for forming a mask pattern is formed on the first-contact-layer forming layer 17A by CVD. The formed silicon oxide film is patterned by photolithography and dry etching to form a striped mask pattern 32.

Figure 5A:
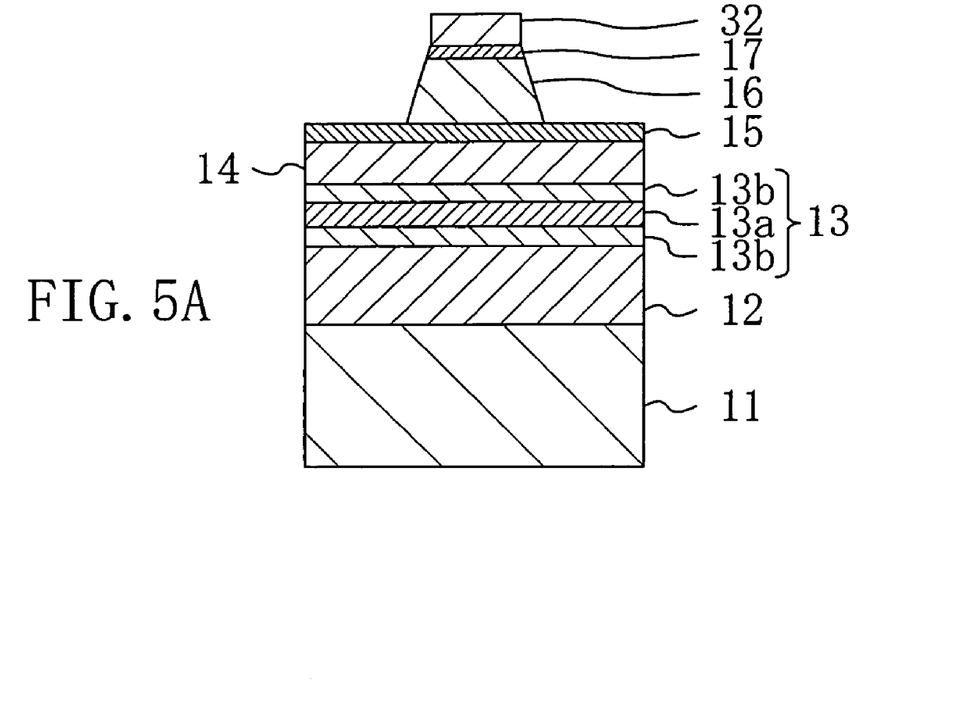
FIGS. 5A and 5B are structural cross-sectional views illustrating the individual process steps of the method for fabricating the semiconductor laser device according to the first embodiment.

Next, as shown in FIG. 5A, the first-contact-layer forming layer 17A and the second-p-type-cladding layer forming layer 16A are selectively removed in succession by etching using the mask pattern 32 so that the ridge-shaped second p-type cladding layer 16 is formed from the second-p-type-cladding layer forming layer 16A and the first contact layer 17 covering the upper sure of the second p-type cladding layer 16 is formed from the first-contact-layer forming layer 17A.

As an etchant for the first contact layer 17, a hydrochloric-acid-based etchant, e.g., may be used appropriately. Selective etching of the second p-type cladding layer 16 can be performed by using an etchant having a high etching selectivity of AlGaInP to GaInP, such as a sulfuric-acid-based etchant, so that the etching stopper layer 15 as the underlying layer is hardly etched. This allows the second p-type cladding layer 16 to be formed into a ridge-shaped configuration.

Figure 5B:
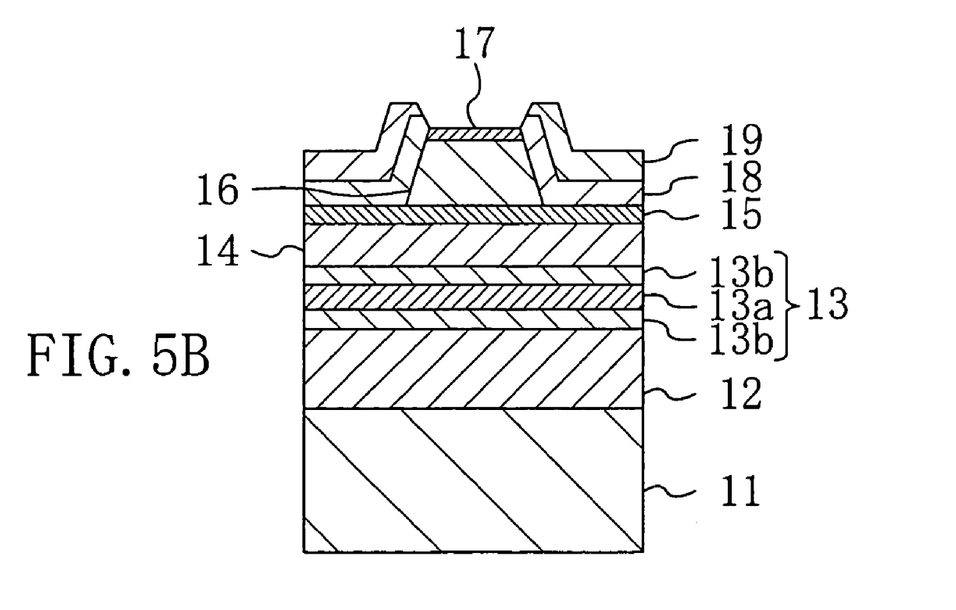

Next, as shown in FIG. 5B, the first and second current blocking layers 18 and 19 are deposited successively by crystal growth on the etching stopper layer 15 in such a manner as to cover the respective side surfaces of the second p-type cladding layer 16 and the first contact layer 17 and the upper surface of the mask pattern 32. Then, a lift-off process is performed with respect to the mask pattern 32 to remove the respective portions of the first and second current blocking layers 18 and 19 overlying the mask pattern 32 simultaneously with the mask pattern 32, thereby exposing the first contact layer 17.

Thereafter, the second contact layer 20 is deposited by crystal growth over the first contact layer 17 and the second current blocking layer 19. Subsequently, a metal material is vapor deposited on the lower side of the n-type substrate 11 by, e.g., electron beam vapor deposition to form the n-side electrode 21. Likewise, a metal material is vapor deposited on the upper side of the second contact layer 20 to form the p-type electrode 22, whereby the semiconductor laser device according to the first embodiment shown in FIG. 1 is completed.

The method for fabricating the semiconductor laser device according to the first embodiment is characterized by doping the first and second p-type cladding layers 14 and 16 with different impurities such that the first p-type cladding layer 14 has a resistivity higher than that of the second p-type cladding layer 16. The first p-type cladding layer 14 is formed while it is doped with Mg. The second p-type cladding layer 16 is formed while it is doped with Zn.

A method for forming each of the semiconductor layers is not limited to MOCVD. Instead of MOCVD, molecular beam epitaxy (MBE) may also be used.

Variation 1 of Embodiment 1

A semiconductor laser device according to a first variation of the first embodiment will be described herein below.

The semiconductor laser device according to the first variation of the first embodiment has the same structure as the semiconductor laser device according to the first embodiment shown in FIG. 2, except that Mg is also used as a dopant for doping the first p-type cladding layer 14 in addition to Zn. The compound composition and film thickness of each of the semiconductor layers are the same as those shown in Table 1. The dopant and doping concentration in each of the semiconductor layers other than the first p-type cladding layer 14 are the same as those shown in Table 1. A description will be given herein below to the difference between the first variation and the first embodiment.

The semiconductor laser device according to the first variation of the first embodiment is different from the first embodiment in that Zn is also used as a third impurity to dope the first p-type cladding layer 14 in addition to Mg. The first p-type cladding layer 14 is doped with Zn and Mg such that the total concentration of Zn and Mg as the p-type impurities is about $1 \times 10^{18}$ cm$^{-3}$, i.e., that the mixture ratio between Zn and Mg is 1.1.

When an AlGaInP-based semiconductor is doped with Mg and Zn at a mixture ratio of 1:1, the mobility in the AlGaIn layer is slightly higher than in the case where only Mg having a large carrier scattering effect is used to dope the AlGaInP layer. This is because, if a plurality of impurities are present in a semiconductor material, the scattering of carriers is greatly influenced by the concentration of a dopant species having a relatively large carrier scattering effect. Therefore, it may be said that, if Zn and Mg are used as p-type dopants for doping a semiconductor made of AlGaInP, the carrier scattering effect is substantially determined by the concentration of Mg. Consequently, the resistivity of the first p-type cladding layer 14 has nearly the same value as in the case where Mg at a concentration of about $5 \times 10^{17}$ cm$^{-3}$ is used to dope the first p-type cladding layer 14.

By doping the first p-type cladding layer 14 with Mg and Zn at a high concentration of about $1 \times 10^{17}$ cm$^{-3}$, the potential barrier of the first p-type cladding layer 14 to the active layer is increased so that the overflow of electrons injected in the active layer 13 into the first p-type cladding layer 14 is suppressed effectively. Since the concentration of Zn is about $5 \times 10^{17}$ cm$^{-3}$, the diffusion of the impurities into the active layer 13 is suppressed. In particular, Mg having a low diffusion coefficient is hardly diffused into the active layer 13. Even if the doping concentration in the first p-type cladding layer 14 is increased to a value higher than in the first embodiment, therefore, the amounts of the impurities diffused into the active layer 13 are barely increased.

Thus, in the semiconductor laser device according to the first variation of the first embodiment, Zn as a dopant having a smaller carrier scattering effect than Mg is used to dope the first p-type cladding layer 14 in addition to Mg as a dopant having a relatively large carrier scattering effect. This provides a larger potential barrier against electrons in the active layer 13 than in the first embodiment, while retaining a high resistivity, and thereby improves the reliability of the semiconductor laser device.

In the first variation of the first embodiment, the mixture ratio between Mg and Zn used to dope the first p-type cladding layer 14 is not limited to 1:1. It is also possible to increase the resistivity of the first p-type cladding layer 14 by increasing the ratio of Mg to Zn such that the diffusion of the current is further suppressed.

The total concentration of Mg and Zn as p-type impurities is preferably in a range not less than $1 \times 10^{18}$ cm$^{-3}$ and not more than $5 \times 10^{18}$ cm$^{-3}$. If the total concentration of Mg and Zn as p-type impurities is adjusted to $1 \times 10^{18}$ cm$^{-3}$ or more, a larger effect of suppressing the overflow of electrons than in the first embodiment is achieved. If the total concentration of Mg and Zn as p-type impurities is adjusted to $5 \times 10^{18}$ cm$^{-3}$ or more, the p-type impurities are diffused from the first p-type cladding layer 14 into the active layer 13 so that the reliability of the semiconductor device is degraded.

In each of the first embodiment and the first variation thereof the combination of impurities used to dope the first p-type cladding layer 14 is not limited to that of Mg and Zn. Any combination of impurities may be used provided that either of the impurities has a larger carrier scattering effect than the impurity used to dope the second p-type cladding layer 16.

Variation 2 of Embodiment 1

A semiconductor laser device according to a second variation of the first embodiment will be described herein below with reference to the drawings.

Figure 6:
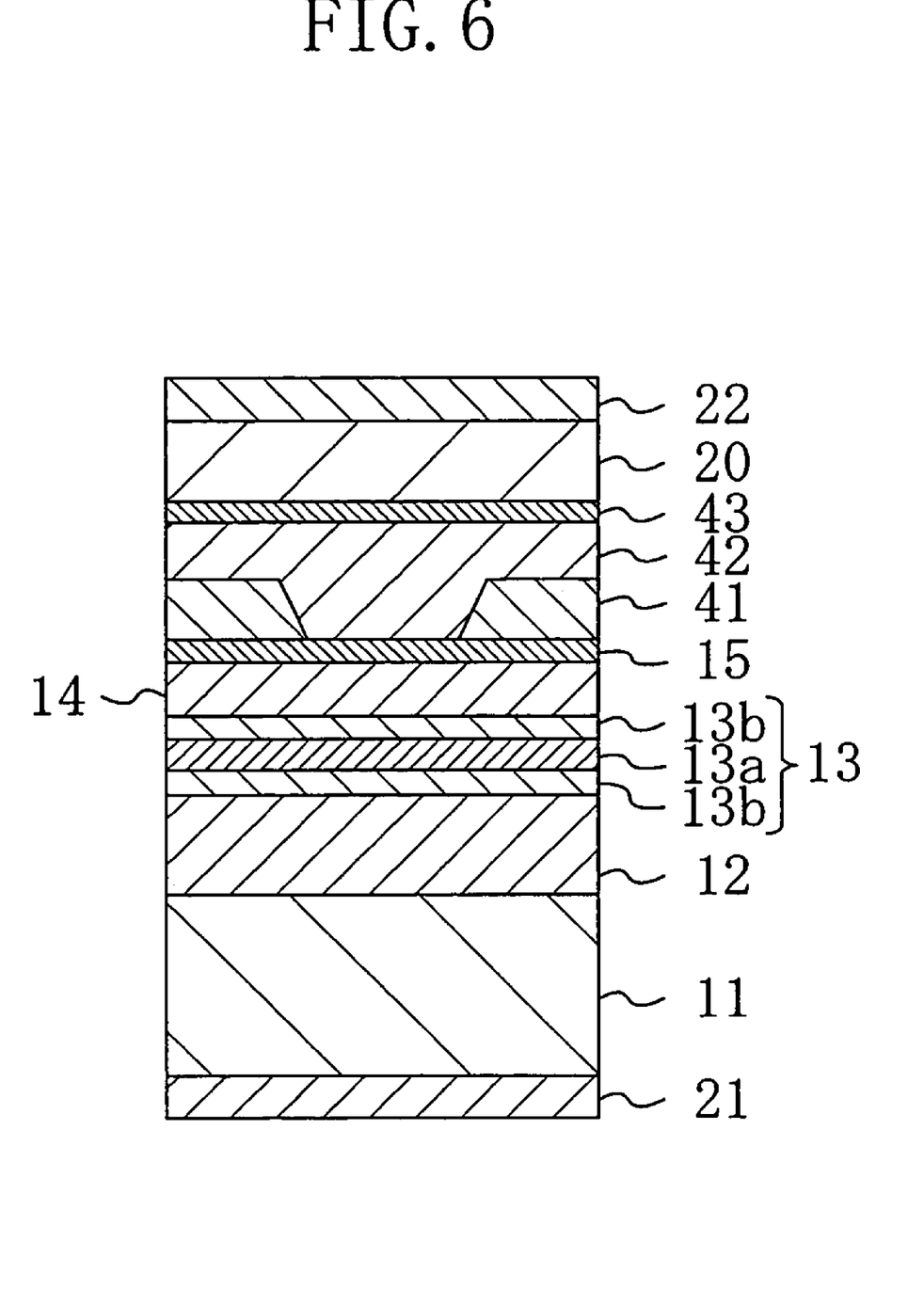
FIG. 6 is a structural cross-sectional view of a semiconductor laser device according to a second variation of the first embodiment.

FIG. 6 shows a cross-sectional structure of the semiconductor laser device according to the second variation of the first embodiment. The description of the components shown in FIG. 6 which are the same as those shown in FIG. 1 will be omitted by retaining the same reference numerals.

As shown in FIG. 6, the n-type cladding layer 12, the active layer 13 having a multiple quantum well structure, the first p-type cladding layer 14, and the etching stopper layer 15 are deposited successively by crystal growth on the n-type substrate 11. A current blocking layer 41 made of n-type $Al_{0.5}In_{0.5}P$ with a film thickness of about 0.3 μm and formed with a stripe trench portion and a second p-type cladding layer 42 made of p-type $Al_{0.35}Ga_{0.15}In_{0.5}P$ with a film thickness of about 2 μm and having a lower portion thereof formed in a stripe configuration to fill the trench portion of the current blocking layer 41 from thereabove are formed on the etching stopper layer 15. A first contact layer 43 and the second contact layer 20 each made of p-type $Ga_{0.5}In_{0.5}P$ with a film thickness of about 50 nm are stacked successively on the second p-type cladding layer 42. The n-side electrode 21 is formed on the lower side of the n-type substrate 11, while the p-type electrode 22 is formed on the upper side of the second contact layer 20.

The semiconductor laser device according to the second variation of the first embodiment is formed as a semiconductor laser device having a so-called inner stripe waveguide structure in which a current blocking layer is formed in a cladding layer. With the application of a specified voltage between the n-side electrode 21 and the p-side electrode 22, a current injected from the p-type electrode is confined by the current blocking layer 41 to reach the active layer 13 and cause radiative recombination so that laser beam oscillation at a wavelength of about 650 mm corresponding to the band gap of the well layer of the active layer 13 occurs.

In contrast to the first embodiment which has formed the second p-type cladding layer 16 into a ridge-shaped configuration so that the film thickness thereof is limited by the width of the upper ridge portion, the second variation of the first embodiment can increase the film thickness of the second p-type cladding layer 42 by forming the inner stripe waveguide structure. As a result, the distance between the active layer 13 and the second contact layer 20 can be increased so that an absorption loss resulting from the absorption of the laser beam oscillated from the active layer 13 by the second contact layer 20 made of GaAs is reduced.

Since the first p-type cladding layer 14 is doped with Mg at a concentration of about $5 \times 10^{17}$ cm$^{-3}$ and the second p-type cladding layer 42 is doped with Zn at a concentration of about $1 \times 10^{18}$ cm$^{-3}$ in the semiconductor laser device according to the second variation of the first embodiment, the ineffective currents resulting from the diffusion of the currents in the first p-type cladding layer 14 can be reduced by increasing the resistivity of the first p-type cladding layer 14 and the series resistance of the semiconductor laser device can be reduced by increasing the doping concentration in the second p-type cladding layer 42.

The second variation of the first embodiment is not limited to the structure using only Mg as the dopant for doping the first p-type cladding layer 14. It is also possible to use Mg and Zn in combination. By doping the first p-type cladding layer 14 with Zn and Mg, it becomes possible, to increase the potential barrier against electrons in the active layer 13, while holding the resistivity of the first p-type cladding layer 14 high, so that the reliability of the semiconductor laser device is improved.

Embodiment 2

The second embodiment of the present invention will be described herein below with reference to the drawings.

Figure 7:
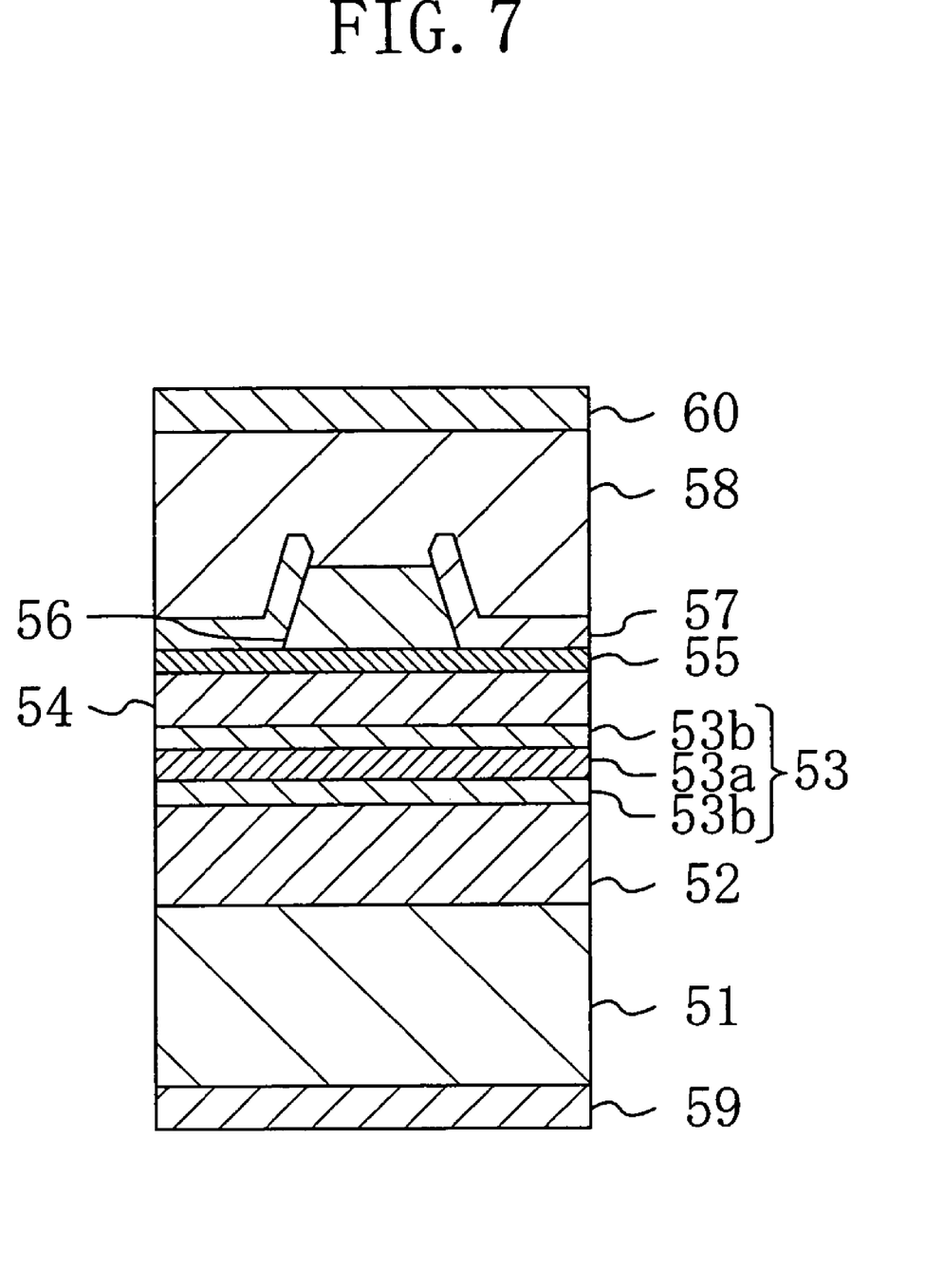
FIG. 7 is a structural cross-sectional view of a semiconductor laser device according to the second embodiment of the present invention.

FIG. 7 shows a cross-sectional structure of the semiconductor laser device according to the second embodiment. The description of the components shown in FIG. 7 which are the same as shown in FIG. 1 will be omitted by retaining the same reference numerals.

As shown in FIG. 7, an n-type cladding layer 52 made of n-type $Al_{0.5}Ga_{0.5}As$ with a thickness of about 2.5 µm, an active layer 53 having a multiple quantum well structure, a first p-type cladding layer 54 made of p-type $Al_{0.5}Ga_{0.5}As$ with a film thickness of about 0.1 µm, an etching stopper layer 55 made of p-type $Al_{0.2}Ga_{0.8}As$ with a film thickness of about 10 nm, and a second p-type cladding layer 56 made of p-type $Al_{0.5}Ga_{0.5}As$ with a film thickness of about 1 µm and formed into a ridge-shaped configuration are deposited successively by crystal growth on an n-type substrate 51 made of n-type GaAs with a thickness of about 100 µm. A current blocking layer 57 made of n-type $\mu l_{0.6}Ga_{0.4}As$ with a film thickness of about 0.7 µm is formed on the etching stopper layer 55 to cover the side surfaces of the second p-type cladding layer 56. A contact layer 58 made of p-type GaAs with a thickness of about 3 µm is formed over the current blocking layer 57 and the second p-type cladding layer 56.

An n-side electrode made of an alloy containing, e.g., Au, Ge, and Ni is formed on the lower side of the n-type substrate 51 to make ohmic contact therewith, while a p-side electrode made of an alloy containing, e.g., Cr, Pt, and Au is formed on the lower side of the n-type substrate 51 to make ohmic contact therewith.

The active layer 53 is composed of: a multiple quantum well layer 53a consisting of well layers each made of undoped GaAs with a film thickness of about 3 nm and a barrier layer made of $Al_{0.3}Ga_{0.7}As$ with a film thickness of about 8 nm, which are alternately stacked; and upper and lower optical guide layers 53b each made of $Al_{0.3}Ga_{0.7}As$ with a film thickness of about 20 nm and having the multiple quantum well layer 53a interposed therebetween.

In the semiconductor laser device according to the second embodiment, the active layer 53 has a multiple quantum well structure having a band gap corresponding to a wavelength of 780 nm. If a current passing through the current blocking layer 57 has reached the active layer 53, a laser beam at an oscillating wavelength of 780 nm is emitted therefrom.

Table 2 shows specific dopant species and doping concentrations in the individual layers of the semiconductor laser device thus constituted.

TABLE 2

| | Thickness | Compound Composition | Dopant | Concentration (cm$^{-3}$) |
|---|---|---|---|---|
| Semiconductor Layer | | | | |
| Contact Layer | 3 µm | GaAs | Zn | $2 \times 10^{19}$ |
| Current blocking layer | 0.7 µm | $Al_{0.6}Ga_{0.4}As$ | Si | $1 \times 10^{18}$ |
| 2nd p-Type Cladding layer | 1 µm | $Al_{0.5}Ga_{0.5}As$ | Zn | $2 \times 10^{18}$ |
| Etching Stopper Layer | 10 nm | $Al_{0.2}Ga_{0.8}As$ | Zn | $1 \times 10^{18}$ |
| 1st p-Type Cladding layer | 0.1 µm | $Al_{0.5}Ga_{0.5}As$ | C | $1 \times 10^{18}$ |
| Active Layer | | | | |
| Quantum Well Layer | | | | |
| Well Layers | 3 nm Each | GaAs | — | — |
| Barrier Layer | 8 nm | $Al_{0.3}Ga_{0.7}As$ | — | — |
| Optical Guide Layers | 20 nm Each | $Al_{0.3}Ga_{0.7}As$ | — | — |
| n-Type Cladding layer | 2.5 µm | $Al_{0.5}Ga_{0.5}As$ | Si | $1 \times 10^{18}$ |
| n-Type Substrate | 100 µm | GaAs | Si | $1 \times 10^{18}$ |

As shown in Table 2, the first p-type cladding layer 54 uses carbon (C) as a p-type dopant and each of the etching stopper layer 45, the second p-type cladding layer 56, and the contact layer 58 uses zinc (Zn) as a p-type dopant in the semiconductor laser device according to the second embodiment. The doping concentration in the first p-type cladding layer 54 is about $1 \times 10^{18}$ cm$^{-3}$, while the doping concentration in the second p-type cladding layer 56 is about $2 \times 10^{18}$ cm$^{-3}$. As an n-type dopant, silicon (Si) at a concentration of about $1 \times 10^{18}$ cm$^{-3}$ is used.

The second embodiment is characterized in that carbon is used as the dopant (first impurity) for doping the first p-type cladding layer 54 and Zn is used as the dopant (second impurity) for doping the second cladding layer 56. Consequently, the resistivity of the first p-type cladding layer 54 becomes higher than that of the second p-type cladding layer 56 so that sidewise ineffective currents flowing in the first p-type cladding layer 54 are reduced without increasing the series resistance of the semiconductor laser device. This is because, if a comparison is made between the respective cases where an AlGaAs-based semiconductor is doped with carbon and zinc, carbon gives greater influence than zinc on the mobility of carriers in the semiconductor.

Accordingly, the carriers injected into the first p-type cladding layer 54 becomes less likely to be diffused therein, in the same manner as in the first embodiment, so that a current is injected efficiently in the active layer 53, while the resistivity of the second p-type cladding layer 56 can be reduced by doping the second p-type cladding layer 56 to a high concentration of $2 \times 10^{18}$ cm$^{-3}$. This reduces the threshold current and operating current of the semiconductor device and provides a high-output semiconductor device.

If Mg is used as a p-type impurity in an AlGaAs-based semiconductor, a problem termed delayed doping in which the semiconductor is not doped with Mg even after the supply of a source for Mg is initiated or a problem termed memory effect in which the semiconductor is doped continuously with Mg even after the supply of the source for Mg is baited occurs so that a specified doping concentration is not obtained. Therefore, the second embodiment has riot used Mg as a p-type impurity.

The second embodiment is not limited to the structure using only carbon as a p-type impurity for doping the first p-type cladding layer 54. In addition to carbon, Zn may also be used as a third impurity. The arrangement increases the impurity concentration in the first p-type cladding layer 54, while keeping the resistivity thereof relatively high, so that the overflow of electrons from the active layer 53 into the first p-type cladding layer 54 is prevented effectively.

The second embodiment is not also limited to the structure having a ridge stripe waveguide in which the second p-type cladding layer 56 is formed into a ridge-shaped configuration on the first p-type cladding layer The second embodiment may also assume a structure having an inner stripe waveguide. Specifically, a current blocking layer having a stripe trench portion is formed on the first cladding layer 54 and the second p-type cladding layer 56 is formed appropriately to have a stripe lower portion for filling up the trench portion in the current blocking layer.

What is claimed is:

1. A semiconductor laser device comprising:
   an active layer;
   a first cladding layer formed on a main surface of the active layer, the first cladding layer being doped with a first impurity to have a dopant concentration higher than $5\times10^{17}$ cm$^{-3}$; and
   a second cladding layer formed on a portion of a main surface of the first cladding layer, the second cladding layer being doped with a second impurity different from the first impurity,
   wherein the first cladding layer has the same conductivity type as that of the second cladding layer, and
   the first cladding layer has a resistivity higher than that of the second cladding layer,
   each of the first and second cladding layers is made of a compound semiconductor containing phosphorus,
   the first impurity is magnesium, and
   the second impurity is zinc.

2. The semiconductor laser device of claim 1, wherein a concentration of the first impurity in the first cladding layer is not more than $1\times10^{18}$ cm$^{-3}$.

3. The semiconductor laser device of claim 1, wherein the first cladding layer also contains a third impurity.

4. A semiconductor laser device comprising:
   an active layer;
   a first cladding layer formed on the active layer, the first cladding layer being doped with a first impurity; and
   a second cladding layer formed on the first cladding layer, the second cladding layer being doped with a second impurity different from the first impurity,
   wherein the first cladding layer has the same conductivity type as that of the second cladding layer,
   the first cladding layer has a resistivity higher than that of the second cladding layer,
   the first cladding layer also contains a third impurity,
   each of the first and second cladding layers is made of a compound semiconductor containing phosphorus,
   the first impurity is magnesium, and
   each of the second and third impurities is zinc.

5. A semiconductor laser device comprising:
   an active layer;
   a first cladding layer formed on the active layer, the first cladding layer being doped with a first impurity; and
   a second cladding layer formed on the first cladding layer, the second cladding layer being doped with a second impurity different from the first impurity,
   wherein the first cladding layer has the same conductivity type as that of the second cladding layer,
   the first cladding layer has a resistivity higher than that of the second cladding layer,
   the first cladding layer also contains a third impurity,
   each of the first and second cladding layers is made of a compound semiconductor containing phosphorus,
   the first impurity is magnesium,
   each of the second and third impurities is zinc, and
   a total concentration of the first and third impurities in the first cladding layer is not less than $1\times10^{18}$ cm$^{-3}$ and not more than $5\times10^{18}$ cm$^{-3}$.

6. The semiconductor laser device of claim 1, wherein the second cladding layer is formed into a ridge-shaped configuration on the first cladding layer.

7. The semiconductor laser device of claim 1, wherein the second cladding layer has a lower portion thereof formed into a stripe configuration.

8. A method for fabricating a semiconductor laser device, the method comprising the steps of:
   forming an active layer on a substrate;
   forming a first cladding layer on a main surface of the active layer, while doping the first cladding layer with a first impurity to have a dopant concentration higher than $5\times10^{17}$ cm$^{-3}$; and
   forming a second cladding layer on a portion of a main surface of the first cladding layer, while doping the second cladding layer with a second impurity different from the first impurity, wherein
   the first cladding layer has the same conductivity type as that of the second cladding layer and has a resistivity higher than that of the second cladding layer,
   each of the first and second cladding layers is made of a compound semiconductor containing phosphorus,
   the first impurity is magnesium, and
   the second impurity is zinc.

9. The method of claim 8, wherein the step of forming the first cladding layer includes doping the first cladding layer with a third impurity in addition to the first impurity.

10. A method for fabricating a semiconductor laser device, the method comprising the steps of:
    forming an active layer on a substrate;
    forming a first cladding layer on the active layer, while doping the first cladding layer with a first impurity; and
    forming a second cladding layer on the first cladding layer, while doping the second cladding layer with a second impurity different from the first impurity, wherein
    the first cladding layer has the same conductivity type as that of the second cladding layer and has a resistivity higher than that of the second cladding layer,
    each of the first and second cladding layers is made of a compound semiconductor containing phosphorus,
    the first impurity is magnesium, and
    each of the second and third impurities is zinc.

* * * * *